United States Patent
Kim

(10) Patent No.: US 7,109,774 B2
(45) Date of Patent: Sep. 19, 2006

(54) DELAY LOCKED LOOP (DLL) CIRCUIT AND METHOD FOR LOCKING CLOCK DELAY BY USING THE SAME

(75) Inventor: Kyung-Hoon Kim, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 0 days.

(21) Appl. No.: 10/749,298

(22) Filed: Dec. 31, 2003

(65) Prior Publication Data

US 2004/0263226 A1    Dec. 30, 2004

(30) Foreign Application Priority Data

Jun. 27, 2003    (KR) ............. 10-2003-0042723

(51) Int. Cl.
*H03H 11/26*    (2006.01)
(52) U.S. Cl. .................... 327/277; 327/158
(58) Field of Classification Search ............. 327/141, 327/147, 149, 152–153, 156, 158, 161, 261, 327/284, 269–271, 276–277
See application file for complete search history.

(56) References Cited

U.S. PATENT DOCUMENTS

| | | | |
|---|---|---|---|
| 4,218,705 A * | 8/1980 | Inaba et al. ............ | 348/512 |
| 5,457,719 A | 10/1995 | Guo et al. | |
| 6,101,197 A | 8/2000 | Keeth et al. | |
| 6,173,432 B1 | 1/2001 | Harrison | |
| 6,252,443 B1 * | 6/2001 | Dortu et al. ............ | 327/156 |
| 6,314,052 B1 * | 11/2001 | Foss et al. ............. | 365/233 |
| 6,339,354 B1 | 1/2002 | Heightley | |
| 6,346,839 B1 | 2/2002 | Mnich | |
| 6,349,122 B1 * | 2/2002 | Woodman, Jr. .......... | 375/373 |
| 6,359,487 B1 | 3/2002 | Heightley et al. | |
| 6,469,559 B1 | 10/2002 | Heightley | |
| 6,490,224 B1 | 12/2002 | Manning | |
| 6,628,155 B1 * | 9/2003 | Park et al. ............ | 327/158 |
| 6,801,472 B1 * | 10/2004 | Lee .................... | 365/233 |
| 6,836,166 B1 * | 12/2004 | Lin et al. ............. | 327/158 |
| 6,839,301 B1 * | 1/2005 | Lin et al. ............. | 365/233 |

FOREIGN PATENT DOCUMENTS

| | | |
|---|---|---|
| JP | 06-188700 | 7/1994 |
| JP | 2002-076861 | 3/2002 |
| KR | 1020040050539 | 6/2004 |

* cited by examiner

*Primary Examiner*—Timothy P. Callahan
*Assistant Examiner*—Cassandra Cox
(74) *Attorney, Agent, or Firm*—Blakely, Sokoloff, Taylor & Zafman

(57) ABSTRACT

A delay line unit of a delay locked loop (DLL) circuit, includes a first delay line having a plurality of first unit delays, each first unit delay having a first delay; a second delay line having a plurality of second unit delays, each second unit delay having a second delay; and a third delay line having a plurality of third unit delays, each third unit delay having a third delay, wherein the first delay is shorter than the second delay, and the second delay is shorter than the third delay.

10 Claims, 8 Drawing Sheets

DELAY LOCKED LOOP (DLL) CIRCUIT AND METHOD FOR LOCKING CLOCK DELAY BY USING THE SAME

FIELD OF THE INVENTION

The present invention relates to a delay locked loop (DLL) circuit used for a synchronous memory device; and, more particularly, to a DLL circuit capable having a different jitter characteristic each for operation frequencies by partially modifying a resolution value of a unit delay and a method for locking a clock delay thereof.

DESCRIPTION OF RELATED ARTS

Generally, a clock signal is used as a reference signal for adjusting operation timing in a system or a circuit, and furthermore, used for securing a rapid operation of the system or the circuit without any error. When the clock signal inputted from an external circuit is used in an internal circuit, a time delay, i.e., a clock skew is generated by the internal circuit. To compensate the time delay and have an identical phase with that of an external clock signal, a delay locked loop (DLL) circuit is used. Namely, the DLL circuit is to match the data output timing through the output driver with that of the external clock signal.

Hereinafter, the DLL circuit applied to a double data rate synchronous dynamic random access memory (DDR SDRAM) will be described.

FIG. 1 is a block diagram showing a conventional register controlled DLL circuit in the DDR SDRAM.

The register controlled DLL circuit includes: a clock buffer block 11 generating internal clock signals rclk and fclk obtained by being synchronized with a rising edge and a falling edge of external clock signals clk and clkb; a clock dividing block 12 outputting a reference clock signal (ref) by dividing the external clock signal clk by n, wherein n is a positive integer; a dummy delay line block 13 receiving the reference clock signal ref; a delay model block 14 configured to allow a clock signal fbk_dly outputted from the dummy delay line block 13 to have an identical delay value with that of the clock signal fbk_dly passing through a real clock path; a phase comparing block 15 for outputting a shift control signal by comparing a phase of the reference signal ref with that of an output signal of the delay model block 14; a delay control block 16 outputting a signal for shifting a clock phase passing through the delay line and the dummy delay line in response to a shift control signal outputted from the phase comparator; and a delay line block 17 shifting the internal clock signals rclk and fclk by receiving the signal outputted from the delay control block 16. A clock buffer not labeled is to provide an internal clock signal to the clock dividing block 12 by receiving the external clock signal clk.

FIG. 2 is a circuit diagram illustrating the clock buffer block 11 shown in FIG. 1.

A differential comparison circuit of the clock buffer block 11 receives the external clock signals clk and clkb, and thereby generates the internal clock rclk and fclk synchronized with the rising edge and the falling edgue of the external clock.

FIG. 3 is a circuit diagram illustrating the clock dividing block 12 shown in FIG. 1.

The clock dividing block 12 outputs the reference clock signal ref after dividing a frequency of the external clock signal clk by 8. At this time, the frequency of the external clock signal clk is divided in order to reduce power consumption.

FIG. 4 is a circuit diagram illustrating the phase comparing block 15 shown in FIG. 1.

As shown, the phase comparing block 15 includes a phase comparing unit 151 and a shift register control signal generating unit 152. The phase comparing block 15 is an apparatus for detecting a difference between the phases of the input/output clock signals of the DLL circuit. More specifically, the phase comparing block 15 compares the phase of a feedback clock signal fbk outputted from the delay model block 14 with that of the reference clock ref outputted from the clock dividing block 12, and thereafter, outputs a signal having delay state information such as a leading state, a lagging state or a locking state. At this time, a shift-right operation is determined by a first comparison signal PC1 and a third comparison signal PC3, and a shift-left operation is determined by a second comparison signal PC2 and a fourth comparison PC4. Also, the shift operation is determined according to the internal clock signal rclk, which is not divided, or a phase comparison between the reference clock signal ref outputted from the clock dividing block 12 and the feed back clock signal fbk outputted from the delay model block 14. More specifically, if the phase difference of the feedback clock signal fbk and the reference clock signal ref is longer than a delay time of a long delay cell, a fifth signal PC5 or a sixth signal PC6 becomes a signal of a logic high state. Therefore, a logic summation signal AC of the comparison signals PC5 and PC6 also becomes a signal of a logic high state. And then, the logic summation signal AC and the internal clock rclk are logically combined to thereby operate a T flip-flop (F/F) of the shift register control signal generating unit 152. Namely, if the phase difference between the feedback clock signal fbk and the reference clock signal ref is relatively long time, the phase difference is rapidly reduced by operating a shift register of the delay controlling unit 16 with the internal clock signal rclk. Thereafter, if the phase difference is decreased to have a predetermined time, both of the fifth signal PC5 and the sixth signal PC6 are transited to a signal of a logic low state. Thereafter, the shift register of the delay controlling unit 16 is operated according to the divided clock signals fbk and ref. The phase comparing block 15 outputs comparison signals, i.e., a shift-right even sre, a shift-right odd sro, a shift-left odd slo and a shift-left even sle to control the shift register of the delay controlling block 16.

FIG. 5 is a circuit diagram illustrating the delay controlling block 16 shown in FIG. 1.

As shown, the delay controlling block includes a logic unit 161 having a plurality of NOR gates REG_0 to REG_N−1 and a shift register unit 162. The logic unit 161 is to determine one of input paths of the delay line block 17 under control of the shift register 162. The shift register unit 52 changes the input path according to comparison signals sre, sro, slo and sle of the phase comparing block 15. Initially, the right-most input path or the left-most input path may be activated to have the minimum delay or the maximum delay. Since the delay controlling unit 16 is the prior art, a detailed description of an operation of the delay controlling unit 16 will be omitted.

FIG. 6 is a circuit diagram illustrating the delay line block 17 shown in FIG. 1.

The delay line block 17 is contrived to delay a phase of a clock signal inputted from clock buffer block 11. At this time, amount of delay is determined by the phase comparing block 15, and a delay path is formed by deciding the phase delay amount with a control of the delay control block 16. The delay line block 17 is constituted with a plurality of unit delay connected in series. The unit delay includes two NAND gates which is connected each other in series and one inverter. Each unit delay is connected to each NOR gate of the logic unit 16 in the delay control block one by one. As one output from the NOR gates REG_0 to REG_N−1 becomes a logic high 'H' signal, amount of delay is determined. Usually, the delay line block 17 is constituted with two types of delay lines, i.e., a delay line used for a rising clock and the other delay line used for a falling clock to thereby reduce a duty ratio distortion by identically delaying the rising clock signal and the falling clock signal.

Even though a circuit diagram concretely illustrating the dummy delay line block 13 is not shown, the dummy delay line block 13 is a delay line used for a feedback clock inputted to the phase comparing block 15. A configuration of the dummy delay line block 13 is identical to that of the delay line block 17 shown in FIG. 6. Only, power consumption is low because a divided clock signal ref is inputted to the dummy delay line block 13.

A delay model block 14 shown in FIG. 1 is a circuit for modeling delay elements having a delay representing until a clock signal inputted from outside of a chip is inputted to the delay line block and an output clock from the delay line block is outputted to the outside of the chip. The clock signal line is a path through which the clock signal flows from the delay line block 17 to an output buffer. The output buffer outputs the clock signal flowing on a clock signal line after synchronizing the clock signal with data signal.

Varying number of unit delays through which the feedback clock passes, the delay line block 17 reduces a phase difference between the internal clock and the external clock. At this time, one unit delay constituted with two NAND gates within the delay line block 17 has about 100 ps resolution. In case that an operation frequency is f, the delay line block 17 is used to delay a phase of the clock signal by an utmost value, i.e., 1/f. Also, the delay line block 17 includes the same number of unit delays identical to the value obtained by dividing the value of 1/f by a delay time of the unit delay cell within the delay line block 17.

The delay locked loop (DLL) comprising all of the unit delays within the delay line block 17 having an identical delay time has following drawbacks.

First, the delay locked loop (DLL) is required to be operated in a high speed and a low speed. In addition, in case that the delay locked loop (DLL) is applied to the specific product, it should be easy to convert an operation speed mode, i.e., from the high speed operation to the low speed operation or from the low speed operation to the high speed operation. Accordingly, for a high frequency operation, the delay time of the unit delay within the delay line block should be reduced. The other hand, the number of the unit delays should be increased by reducing the delay time of the unit delay cell for a low frequency operation. Accordingly, size of a layout of the delay locked loop (DLL) is increased and a current amount for operating the delay locked loop (DLL) is increased.

Consequently, it is needed that the required current amount is reduced as much as possible without increasing the size of the layout. For a high speed operation of an electronic system, the operation frequency of the delay locked loop (DLL) is also required to be high. However, there is no request for change of functions at a low frequency, and therefore, it is difficult to obtain a standard optimization capable of adequately satisfying both of the high speed operation and the low speed operation.

To solve above-mentioned drawbacks, the delay locked loop (DLL) operated in both of a coarse delay mode and a fine delay mode should be used. However, an interconnection problem between the coarse delay mode and the fine delay mode occurs, and furthermore, size of a circuit layout is increased because a complicated control circuit is used to interconnect independent delay line blocks.

SUMMARY OF THE INVENTION

It is, therefore, an object of the present invention to provide a delay locked loop (DLL) used for a synchronous memory device capable of rapidly performing a clock delay locking operation and a method for locking clock delay.

In accordance with an aspect of the present invention, there is provided a delay line unit of a delay locked loop (DLL) circuit, including: a first delay line having a plurality of first unit delays, each first unit delay having a first delay; a second delay line having a plurality of second unit delays, each second unit delay having a second delay; and a third delay line having a plurality of third unit delays, each third unit delay having a third delay, wherein, the first delay is shorter than the second delay, and the second delay is shorter than the third delay.

In accordance with another aspect of the present invention, there is provided a clock signal delay locking method in a delay locked loop (DLL) of a synchronous memory device, including steps of: a) generating a comparison signal for comparing a reference signal with a feedback signal generated from a delay model; b) generating a control signal in response to the comparison signal; and c) delaying a clock signal by using a delay line unit containing a plurality of unit delays, each unit delay having a different resolution each other, in response to the control signal.

BRIEF DESCRIPTION OF THE DRAWINGS

Other objects and aspects of the invention will become apparent from the following description of the embodiments with reference to the accompanying drawings, in which.

DETAILED DESCRIPTION OF THE PRESENT INVENTION

Hereinafter, a delay locked loop (DLL) circuit used for a synchronous memory device capable will be described in detail referring to the accompanying drawings.

Generally, the DLL circuit includes a delay line unit for delaying an internal clock signal in order to match a phase of the internal clock signal with that of an external clock signal under control signals of a delay control unit. since amount of delay of the DLL circuit is implemented from 0 to one period (referred to as Tclk) of a clock signal, the number of the unit delays is limited according to a frequency to the clock signal. Namely, the number of the unit delays in the DLL circuit is determined by an operation frequency. If one period of the operation frequency is 5 ns and a resolution of the unit delay is 100 ps, 50 unit delays can be used.

Figure 7:
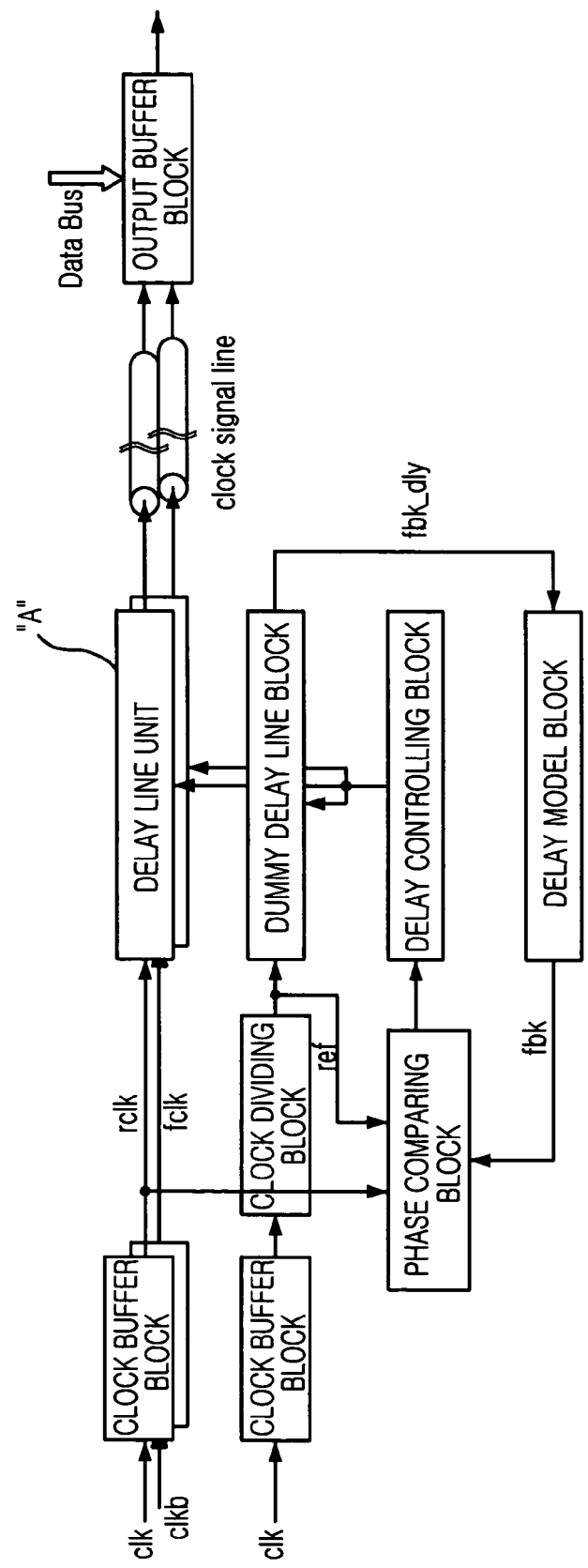
FIG. 7 is a block diagram illustrating a delay locked loop circuit in accordance with the present invention.

FIG. 7 is a block diagram illustrating a delay locked loop circuit in accordance with the present invention.

Figure 1:
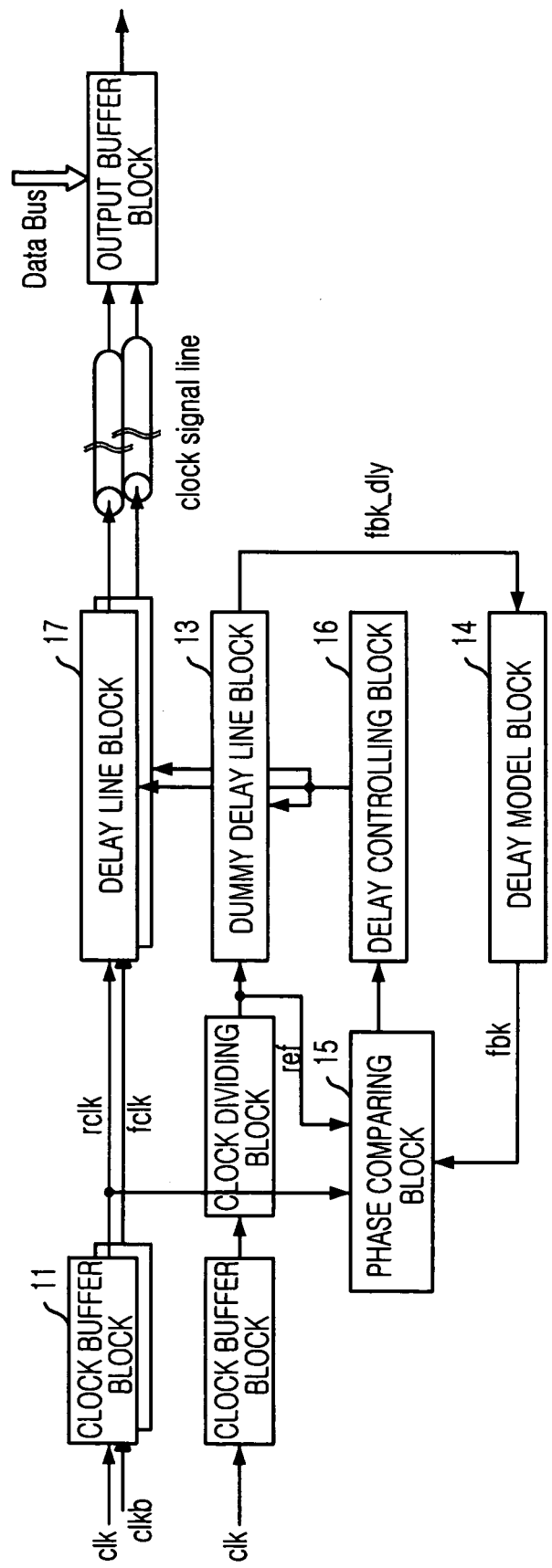
FIG. 1 is a block diagram showing a conventional register controlled DLL circuit in the DDR SDRAM.
Figure 2:
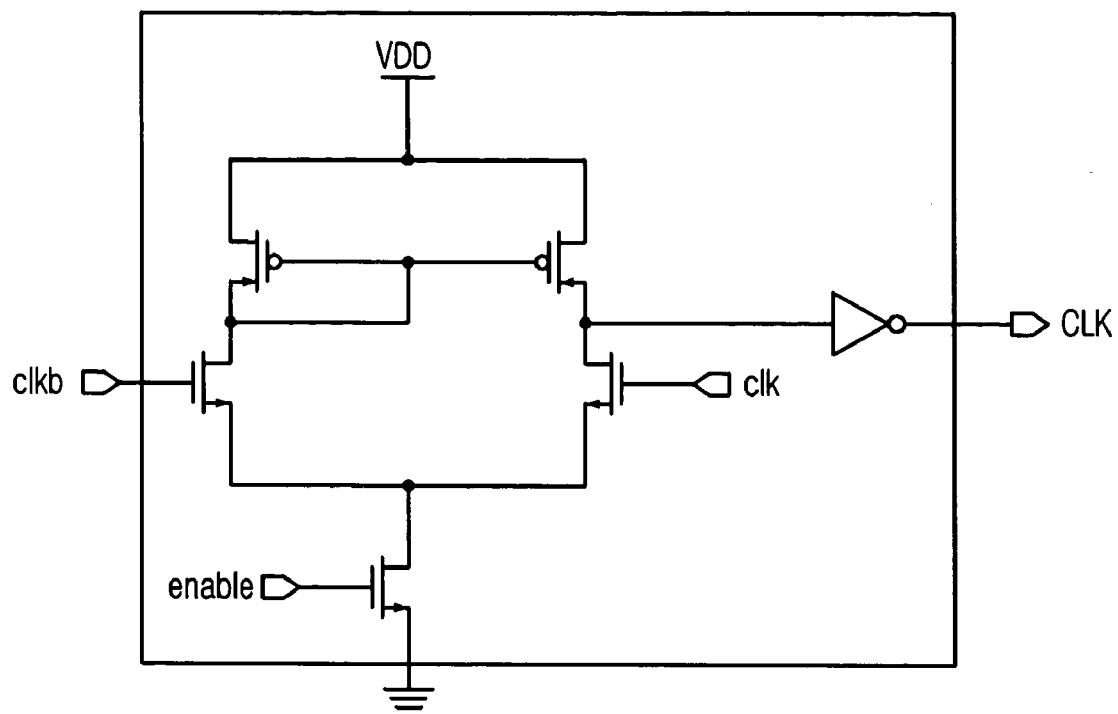
FIG. 2 is a circuit diagram illustrating the clock buffer block shown in FIG. 1.
Figure 3:
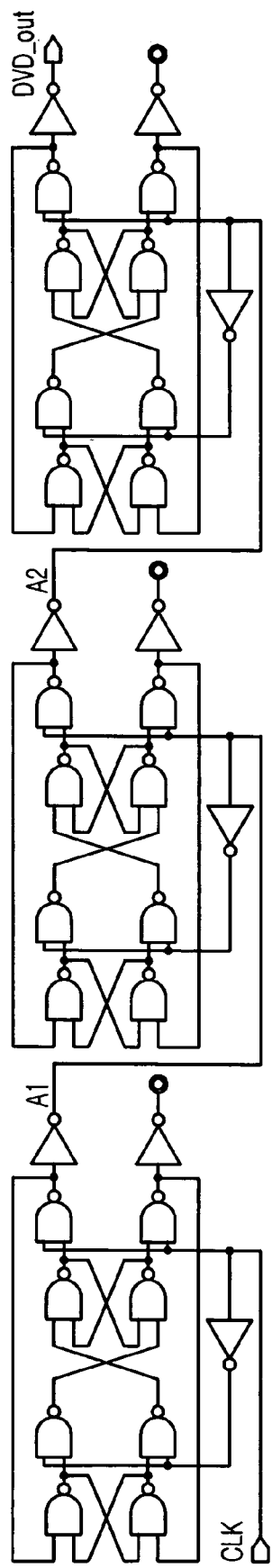
FIG. 3 is a circuit diagram illustrating the clock dividing block shown in FIG. 1.
Figure 4:
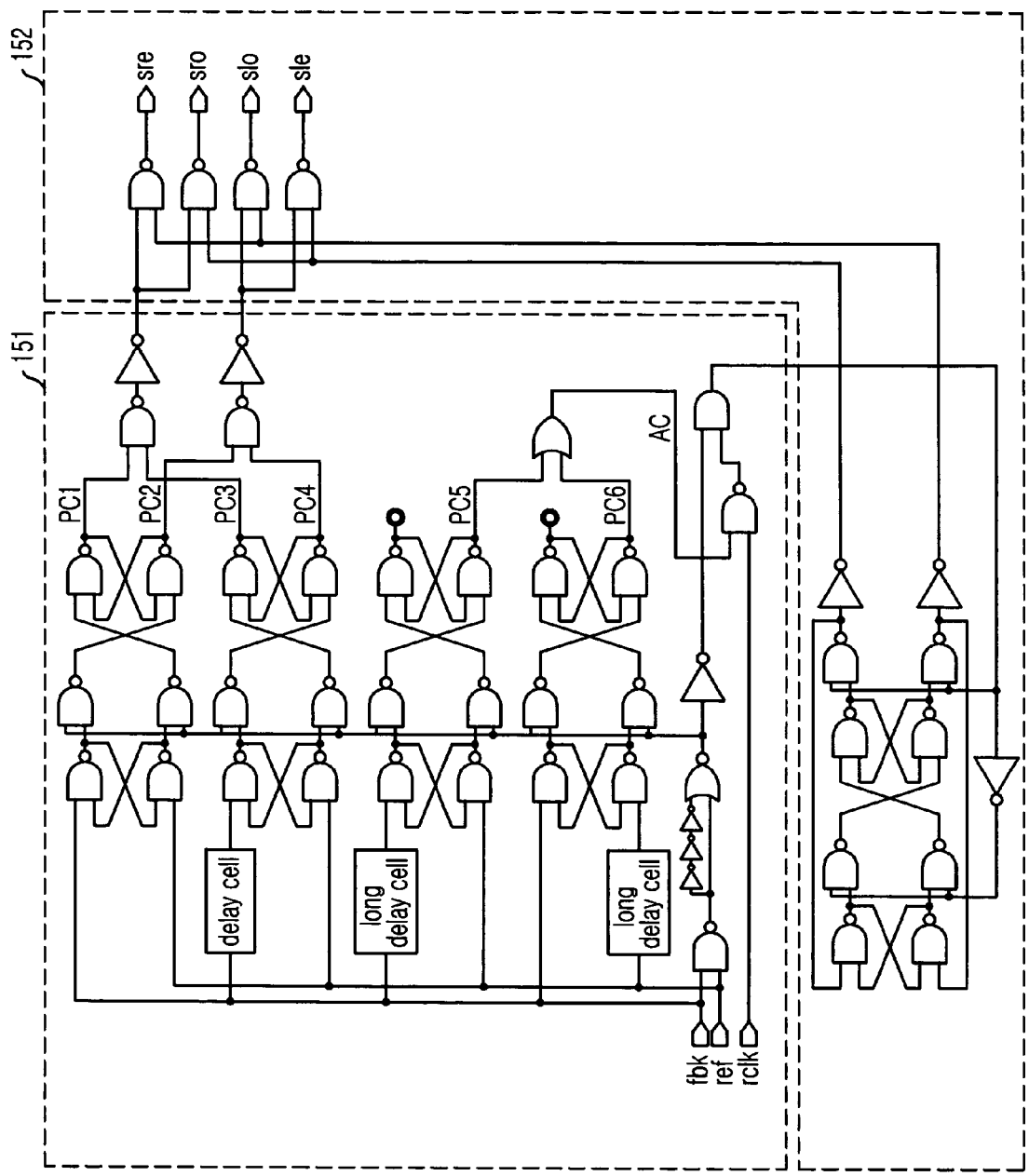
FIG. 4 is a circuit diagram illustrating the phase comparing block shown in FIG. 1.
Figure 5:
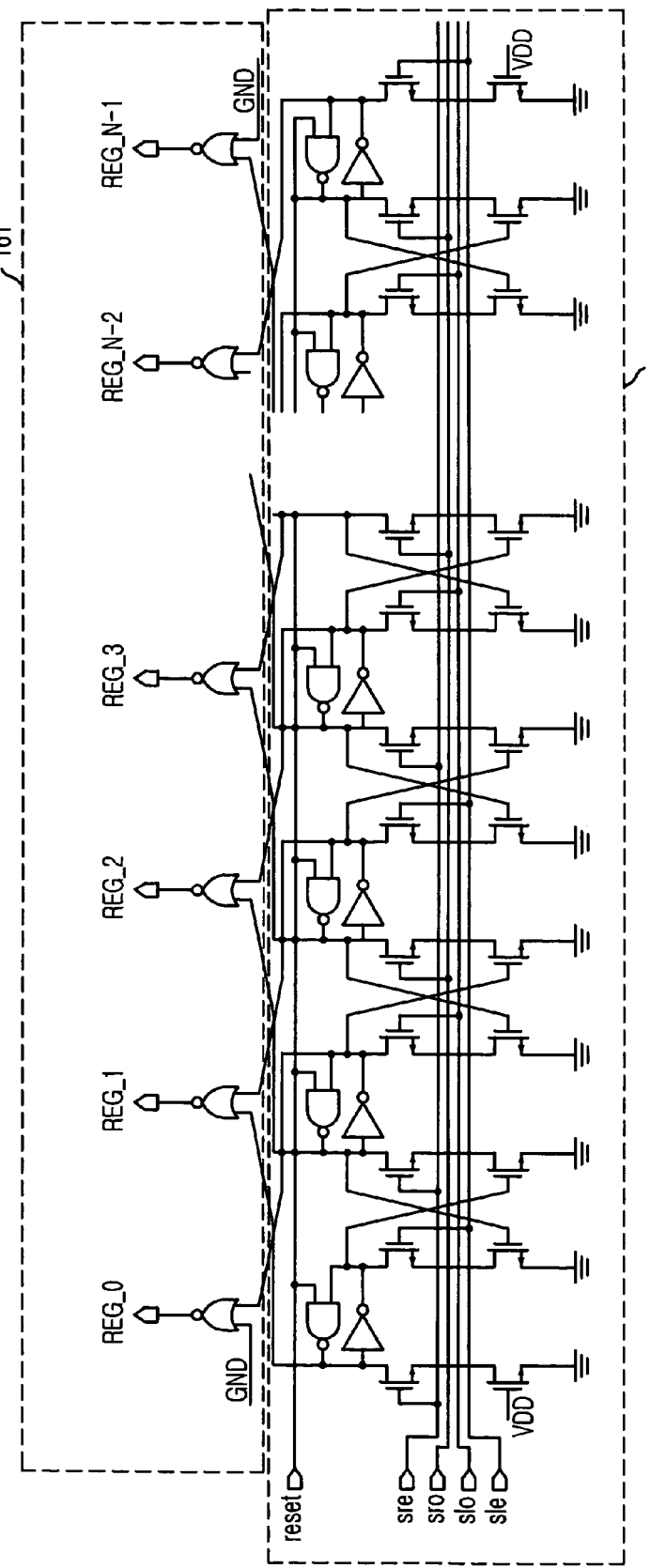
FIG. 5 is a circuit diagram illustrating the delay controlling block shown in FIG. 1.
Figure 6:
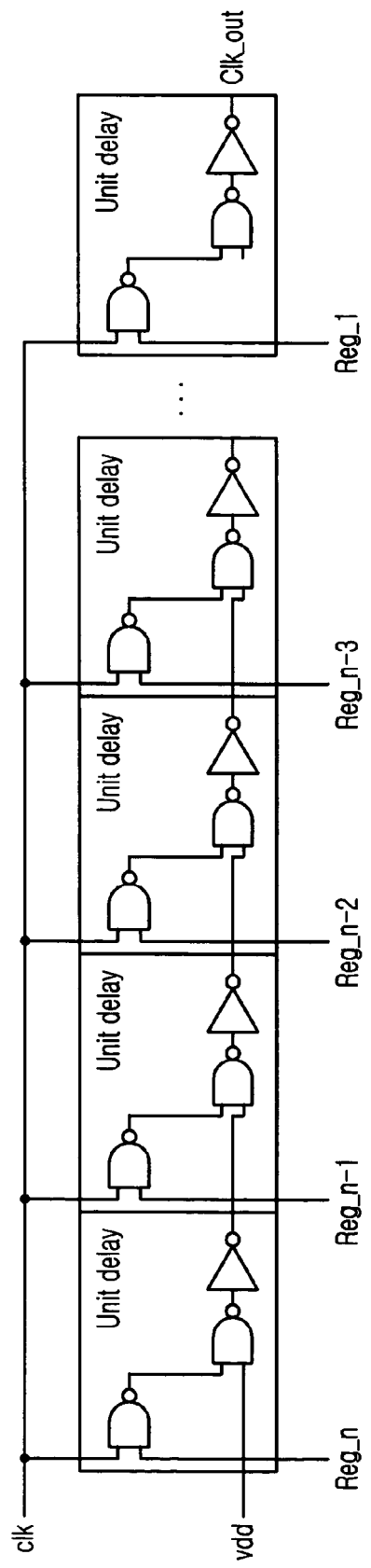
FIG. 6 is a circuit diagram illustrating the delay line block shown in FIG. 1.

As shown, the configuration of the DLL circuit of the present invention is similar to that of the conventional DLL circuit in FIG. 1. However, the delay line unit of the present invention is differently configured from the convention delay line block 17 in FIG. 1. Therefore, since other elements except the delay line unit are identically operated with the conventional DLL circuit, detailed description of operations for each elements will be omitted. Also, reference symbols used in FIGS. 1 to 6 are identically used in FIG. 7 for the same things.

Figure 8:
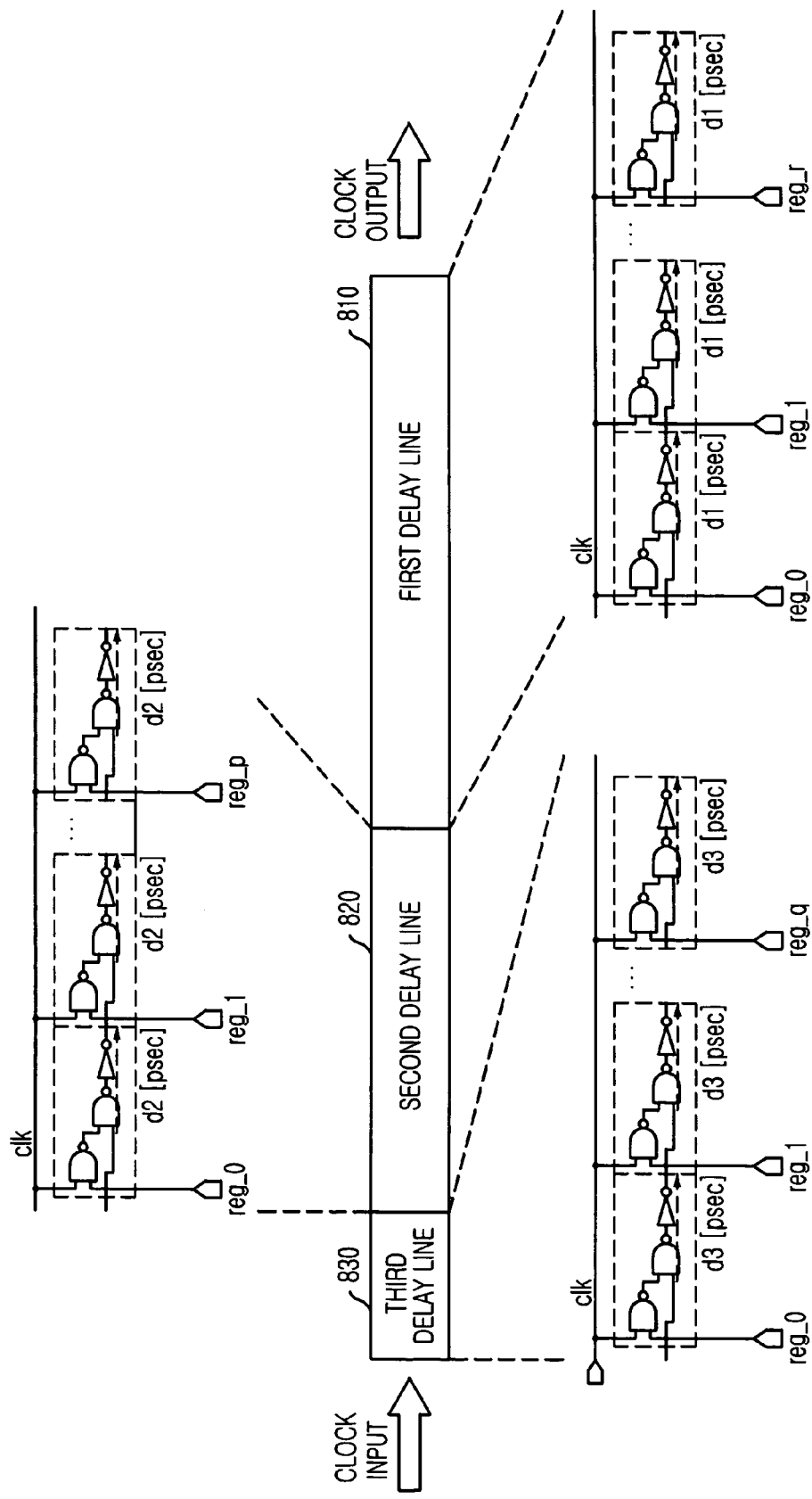
FIG. 8 is a block diagram illustrating the delay line unit in the DLL circuit in FIG. 7 in accordance with the present invention.

FIG. 8 is a block diagram illustrating the delay line unit "A" in the DLL circuit in FIG. 7 in accordance with the present invention.

As shown, the delay line unit has a first delay line 810 containing a plurality of first unit delays, each first unit delay having a first delay 'd1', a second delay line 820 containing a plurality of second unit delays, each second unit delay having a second delay 'd2', and a third delay line 830 containing a plurality of third unit delays, each third unit delay having a third delay 'd3.'

The unit delay is classified with the first unit delay for a high frequency, the second unit delay for a middle frequency, and the third unit delay for a low frequency. If the high frequency is defined to be over 200 MHz, the middle frequency may be defined to be from 100 MHz to 200 MHz, and the low frequency may be defined to be below 100 MHz. Therefore, if the clock period Tclk of the high frequency is 5 ns, the required number of the first unit delays is 5 ns/d1, and if the clock period Tclk of the middle frequency is 5 ns to 10 ns, the required number of the second unit delays becomes (5 ns to 10 ns)/d2. Also, if a clock period of the low frequency is 12 ns to 10 ns, the required number of the third delays becomes (12 ns to 10 ns)/d3.

Accordingly, if the delay line unit is configured to have a resolution of 65 ps for securing an operation of over 200 MHz, a resolution of 100 ps for securing an operation of 100 to 200 MHz, or a resolution of 150 ps for below 100 MHz, 77 first unit delays in the first delay line 810, 50 second unit delays in the second delay line 820, and 14 third unit delays in the third delay line 830 are required. The resolution of each unit delay can be determined by adjusting length or width of NMOS transistor or PMOS transistor in the NAND gate and the inverter of the unit delay. Also, the resolution can be adjusted according to the voltage applied to the unit delay in the delay line.

If all unit delays in the delay line unit have the same resolution of 65 ps, 185 unit delays are required. As well-known, the delay line unit occupies the largest area in the DLL circuit. Therefore, the area of the delay line unit can be reduced by 75% against a case using the same unit delay.

Hereinafter, an operation of the delay line unit will be described. The control signals reg_0 to reg_r inputted to the delay line unit are generated from the delay controlling block in FIG. 7. If the control signal reg_r becomes a logic high level, an clock signal inputted to the delay line unit is delayed as much as delay of one unit delay, and then if the control signal reg_1 becomes a logic high level, the input clock signal is delayed as much as delay of two unit delay.

Since the delay of the input clock signal is implemented at the left-most unit delay in the first delay line 810, it is preferable that the first delay 'd1' of the first unit delay line 810 is configured to have the shortest delay. Therefore, if the DLL circuit in accordance with the present invention is operated for the high frequency, a phase locking process can be achieved at the first delay line 810, and, at low frequency, the phase locking operation can be achieved at the second delay line 820 or the third delay line 830.

As the delay line unit is configured with a plurality of delay lines having different unit delay each other, the DLL circuit can be used at wide frequency band and the phase locking operation can be rapidly achieved. Also, the area of the delay line unit can be reduced.

What is claimed is:

1. A delay line unit of a delay locked loop (DLL) circuit, comprising:
    a first delay line having a plurality of first unit delays, each first unit delay having a first delay, for delaying a clock signal;
    a second delay line having a plurality of second unit delays, each second unit delay having a second delay, for delaying the clock signal to output the delayed clock signal into the first delay line if a delay locking operation is not achieved in the first delay line; and
    a third delay line having a plurality of third unit delays, each third unit delay having a third delay, for delaying the clock signal to output the delayed clock signal into the second delay line if the delay locking operation is not achieved in the second delay line,
    wherein the first delay is shorter than the second delay, and the second delay is shorter than the third delay.

2. The delay line unit as recited in claim 1, wherein the first, second and third delays are connected in series.

3. The delay line unit as recited in claim 1, wherein the number of the first delays are more than that of the second delays and the number of the second delays are more than that of the third delays.

4. A delay locked loop (DLL) circuit used in a synchronous memory device, comprising:
    a phase comparing unit for comparing a reference signal with a feedback signal and generating a comparison signal;
    a delay controlling unit for generating a control signal in response to the comparison signal;
    a delay line unit for delaying an internal clock signal in response to the control signal; and
    a delay model for generating a feed back signal by delaying a clock signal,
    wherein the delay line unit includes:
    a first delay line having a plurality of first unit delays, each first unit delay having a first delay, for delaying a clock signal;
    a second delay line having a plurality of second unit delays, each second unit delay having a second delay, for delaying the clock signal to output the delayed clock signal into the first delay line if a delay locking operation is not achieved in the first delay line; and
    a third delay line having a plurality of third unit delays, each third unit delay having a third delay, for delaying the clock signal to output the delayed clock signal into the second delay line if the delay locking operation is not achieved in the second delay line,
    wherein the first delay is shorter than the second delay, and the second delay is shorter than the third delay.

5. The DLL circuit as recited in claim 4, wherein the first, second and third delay lines are connected in series.

6. The delay line unit as recited in claim 4, wherein the number of the first delays are more than that of the second delays and the number of the second delays are more than that of the third delays.

7. A clock signal delay locking method in a delay locked loop (DLL) of a synchronous memory device, comprising the steps of:
   a) generating a comparison signal for comparing a reference signal with a feedback signal generated from a delay model;
   b) generating a control signal in response to the comparison signal; and
   c) delaying a clock signal by using a delay line unit containing a plurality of unit delays, each unit delay having a different resolution each other, in response to the control signal,
wherein the step c) includes the steps of:
   c1) delaying the clock signal through by a first delay line containing a plurality of first unit delays, each having a first resolution;
   c2), if a delay locking operation is not achieved in the step c1), delaying the clock signal to output the delayed clock signal into the first delay line by a second delay line containing a plurality of second unit delays, each having a second resolution, which is higher than the first resolution; and
   c3), if the delay locking operation is not achieved in the step c2), delaying the clock signal through an output to output the delayed clock signal into the second delay line by a third delay line containing a plurality of third unit delays, each having a third resolution, which is higher than the second resolution.

8. The clock signal delay locking method as recited in claim 7, wherein the first, second and third delay lines are connected in series.

9. A delay line unit of a delay locked loop (DLL) circuit, comprising:
   a first delay line having a plurality of first unit delays, each first unit delay having a first delay, for delaying a clock signal at a first frequency;
   a second delay line having a plurality of second unit delays, each second unit delay having a second delay, for delaying the clock signal to output the delayed clock signal into the first delay line if a delay locking operation is not achieved in the first delay line at a second frequency wherein the first frequency is higher than the second frequency; and
   a third delay line having a plurality of third unit delays, each third unit delay having a third delay, for delaying the clock signal to output the delayed clock signal into the second delay line if the delay locking operation is not achieved in the second delay line at a third frequency wherein the second frequency is higher than the third frequency,
   wherein the first delay is shorter than the second delay, and the second delay is shorter than the third delay.

10. The delay line unit as recited in claim 9, wherein the number of the first delays are more than that of the second delays and the number of the second delays are more than that of the third delays.

* * * * *

UNITED STATES PATENT AND TRADEMARK OFFICE
CERTIFICATE OF CORRECTION

| | | |
|---|---|---|
| PATENT NO. | : 7,109,774 B2 | Page 1 of 1 |
| APPLICATION NO. | : 10/749298 | |
| DATED | : September 19, 2006 | |
| INVENTOR(S) | : Kim | |

It is certified that error appears in the above-identified patent and that said Letters Patent is hereby corrected as shown below:

Col. 7, line 28;
In Claim #7, Line 24, please delete "through an output".

Signed and Sealed this

Twenty-seventh Day of March, 2007

JON W. DUDAS
*Director of the United States Patent and Trademark Office*